United States Patent [19]

Tumeo

[11] Patent Number: 4,792,987
[45] Date of Patent: Dec. 20, 1988

[54] ANTENNA COUPLING AMPLIFIER AND CONVERTER SYSTEM

[75] Inventor: A. Ray Tumeo, San Diego, Calif.

[73] Assignee: Starke Electronics, Inc., San Diego, Calif.

[21] Appl. No.: 689,935

[22] Filed: Jan. 9, 1985

[51] Int. Cl.$^4$ .............. H04B 11/18; H04B 1/26; H03F 1/36; H03F 3/04
[52] U.S. Cl. .................. 455/131; 455/319; 455/323; 330/85; 330/277; 330/296
[58] Field of Search .............. 455/131, 319, 291, 323, 455/325, 283, 341; 330/277, 294, 296, 85, 86

[56] References Cited

U.S. PATENT DOCUMENTS

| | | | |
|---|---|---|---|
| 3,007,044 | 10/1961 | Cookson | 250/20 |
| 3,246,245 | 4/1966 | Turner | 325/442 |
| 3,350,648 | 10/1967 | Beres et al. | 325/440 |
| 3,576,495 | 4/1971 | Yoshizato | 325/436 |
| 3,579,113 | 5/1971 | Jabbar | 325/376 |
| 3,824,600 | 7/1974 | Majkrzak et al. | 343/895 |
| 4,053,847 | 10/1977 | Kumahara et al. | 330/277 |
| 4,056,785 | 11/1977 | Burke | 330/53 |
| 4,158,817 | 6/1979 | Locherer | 325/485 |
| 4,288,875 | 9/1981 | Carter | 455/197 |
| 4,356,493 | 10/1982 | Bogner | 343/702 |
| 4,402,089 | 8/1983 | Knight et al. | 455/186 |
| 4,429,417 | 1/1984 | Yool | 455/291 |
| 4,499,430 | 2/1985 | Fujii | 330/85 |
| 4,532,477 | 7/1985 | Green, Jr. et al. | 330/296 |
| 4,543,536 | 9/1985 | Pedersen | 330/85 |

FOREIGN PATENT DOCUMENTS 52-16956  8/1977  Japan .................... 330/296

OTHER PUBLICATIONS

Cooper, Jr., "Radio Electronics", 8/81.
"Integration Simplifies TVRO Design", Fornaciari, 3/77.
"Low-Noise Design Trends Using State-of-the-Art Building Blocks", Okean et al., 9/76.

Primary Examiner—Robert L. Griffin
Assistant Examiner—Curtis Kuntz
Attorney, Agent, or Firm—Brown, Martin, Haller & Meador

[57] ABSTRACT

An antenna coupling system includes separate low-noise receiving amplifier and down converter circuits for amplifying the antenna signal above background noise and for converting it down to frequencies compatible with a suitable receiver, respectively. The system is particularly intended for microwave frequency antennas of the type used to receive satellite signals. The amplifier circuit includes at least one microwave frequency amplifier, such as a GaAs FET, with a low frequency variable feedback circuit connected across it which is arranged to self-tune the amplifier to the antenna input signal strength. The converter circuit is of the image reject single conversion and image recovery type and is arranged to split the amplifier output signal into two parts which are each combined with a local oscillator signal and then re-combined in such a way that unwanted image signals are rejected.

4 Claims, 3 Drawing Sheets

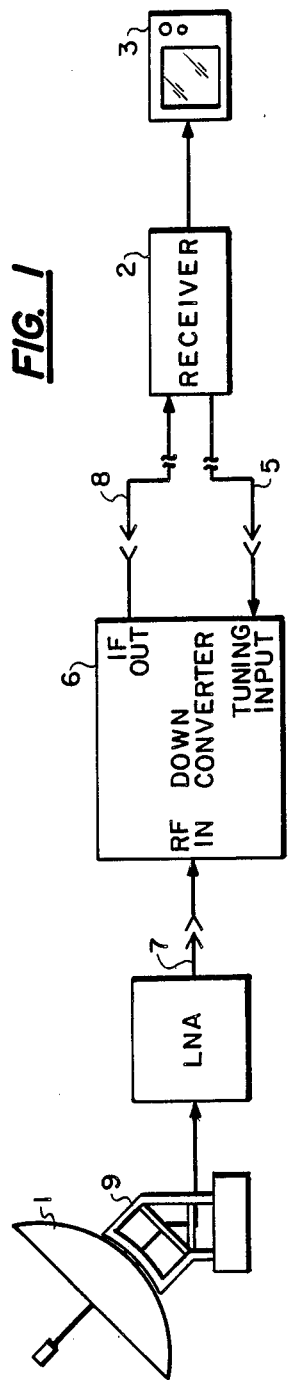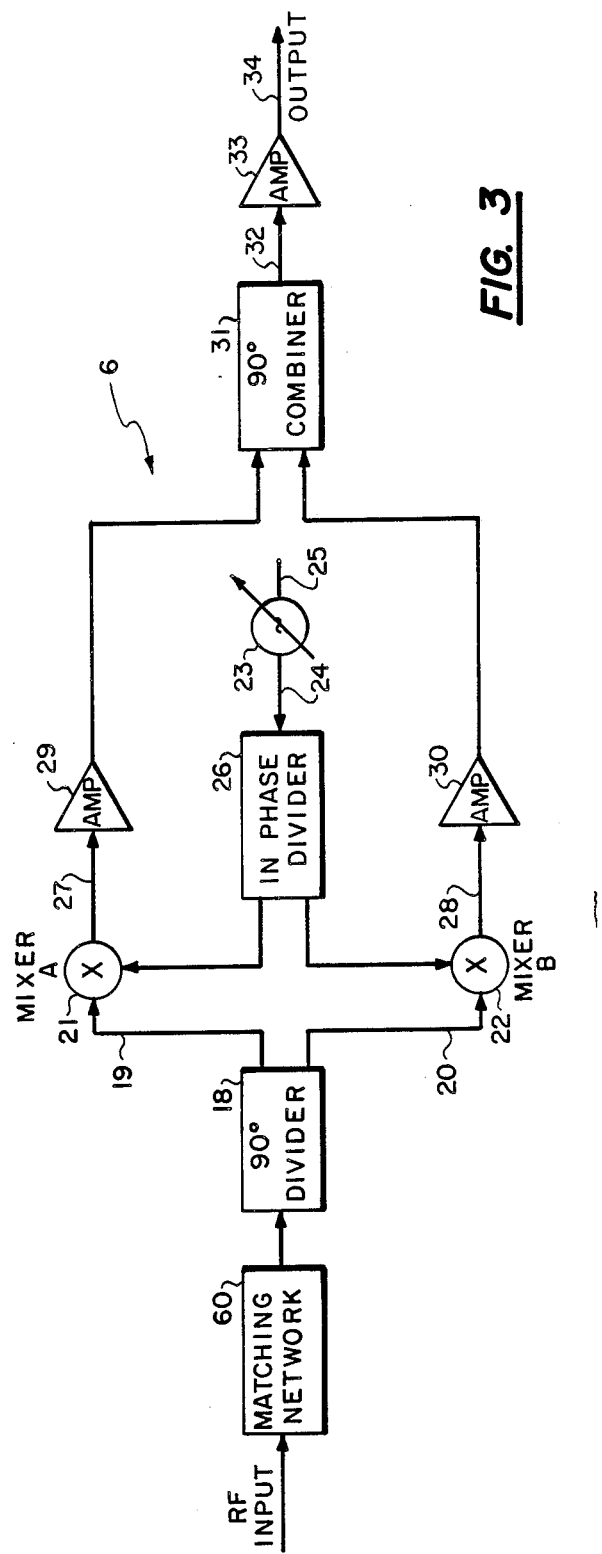

ANTENNA COUPLING AMPLIFIER AND CONVERTER SYSTEM

BACKGROUND OF THE INVENTION

The present invention relates to a low-noise receiving amplifier and down converter system for coupling an antenna to a receiver. It is particularly intended for coupling microwave antennas of the type used to receive satellite signals in the microwave frequency range.

Coupling circuits for microwave antennas operate in the 1 GHz to 40 GHz range. The signal from the satellite must be received and down converter to a frequency which is compatible with a conventional satellite receiver. Such satellite signals are typically very low power (typically 5 Watt peak) and there is a fairly high loss between the satellite and the receiving station.

Antenna coupling circuits generally include some type of receiving amplifier for amplifying the signal above the thermal background noise and a down converter comprising a mixer and local oscillator for tuning and converting the frequency down to an intermediate frequency which can be accepted by the conventional receiver, for example a television or satellite receiver.

U.S. Pat. No. 4,429,417 of Yool shows one system for amplifying and converting microwave signals of this type. An integrated amplifier and converter circuit is mounted on the microwave antenna. The circuit must be matched or tuned to the antenna input signal and this is done by means of several fixed inductors. Thus, the circuit will not be perfectly matched if there is a slight change in the signal, and it must be set up in advance for the particular antenna used.

SUMMARY OF THE INVENTION

It is an object of the present invention to provide a receiving amplifier for a microwave antenna which does not have to be fine-tuned to an antenna signal or system.

It is a further object of the invention to provide a low-noise receiving amplifier and converter system for coupling a microwave antenna to a suitable receiver.

According to the present invention, a two stage low-noise receiving amplifier and converter system for coupling a microwave antenna to a receiver is provided. The first stage comprises a low-noise receiving amplifier circuit which includes at least one microwave frequency amplifier with a low-frequency variable feedback circuit connected across it to bias the amplifier into its optimum operating range. With this structure the amplifier circuit does not have to be tuned, retuned or fine tuned to the antenna signal since it will automatically adjust to its optimum range as a function of the input signal strength.

In the preferred embodiment of the invention the variable feedback circuit having a low frequency biasing transistor is connected across a microwave amplifier to reverse bias it into its saturation region. The feedback transistor is arranged to maintain the microwave amplifier's gate voltage at a constant operating point so that the microwave amplifier operates in its optimum range for a wide range of power and frequency of the microwave input signal.

Preferably two amplifiers, which may be GaAs FET amplifiers, are connected in cascade in the circuit with respective low-frequency feedback transistors connected across each of them to develop an active feedback bias. The amplifier is thus self-tuning for a wide range of microwave input signal strength and frequencies.

The output of the amplifier circuit is connected through suitable microwave frequency conductors and connectors to a down converter circuit for converting the amplified microwave signal to an intermediate frequency (IF) signal, suitably a frequency of the order of 70 MHz. The circuit preferably comprises an image reject single conversion image recovery mixer system type converter which divides the signal into two parts having a respective 90 degree phase shift, mixes each part with a lower frequency signal, and then recombines the mixed signals. This rejects undesired image signals.

The low-noise receiving amplifier and down converter are preferably mounted at or very near the feed of the antenna. Thus only a small length of low loss type microwave cabling is required, and less expensive conventional receiver cabling can be used to connect the down converter to the receiver. In the preferred embodiment, the amplifier and converter are separate units and therefore, the whole system does not have to be replaced if one part fails. The supply and tuning voltage for the system may be provided by the receiver itself as a dc voltage level superimposed on the center signal conductor of the receiver to the down converter connecting coaxial cable and a tuning cable for the dc tuning biasing signal.

BRIEF DESCRIPTION OF THE DRAWINGS

The above and other details and specific objects, features and advantages of the present invention will become clear from a consideration of the following detailed description of a preferred embodiment and a perusal of the associated drawings in which:

FIG. 1 is a block diagram of a low-noise amplifier and down converter system according to a preferred embodiment of the invention;

FIG. 3 is a block diagram of the down converter circuit of the system of FIG. 1.

DESCRIPTION OF THE PREFERRED EMBODIMENT

Figure 2:
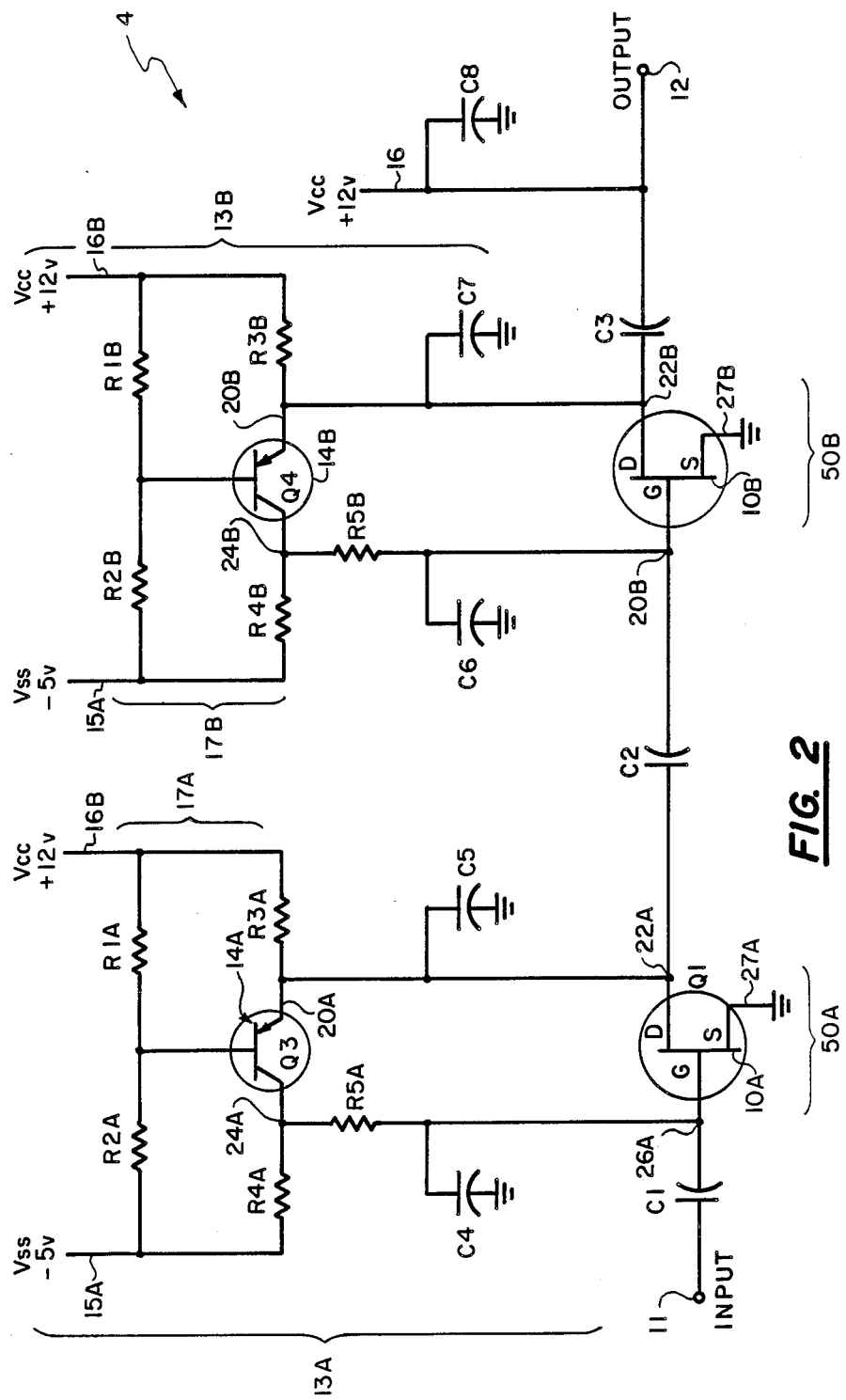
FIG. 2 is a circuit diagram of the low-noise amplifier circuit of the system of FIG. 1.

FIG. 1 shows a basic system for connecting an antenna 1 to a suitable receiver 2 for displaying the audio/video information on the antenna signal on a suitable output device such as a TV monitor 3. The system according to a preferred embodiment of the invention comprises a low-noise receiving amplifier (LNA) 4 for amplifying the antenna signal carried on conductor 9 above the background noise and a down converter 6 for converting the amplified signal carried on conductor 7 into an intermediate frequency (IF) signal carried on conductor 8 to the conventional receiver 2. In the preferred embodiment of the invention the Antenna Coupling Amplifier and Converter System is arranged to receive, amplify and convert high frequency signals in the 1 to 40 GHz or microwave range such as are typically transmitted by satellites, although it may be designed for use at other lower frequencies.

The Low-Noise Amplifier (LNA) 4 circuit is shown in detail in FIG. 2. A typical satellite transmission is a weak microwave signal which is received by a microwave satellite antenna and conducted to a receiving amplifier which must have very high gain and low noise. The LNA of this invention is designed to mount adjacent the receiving antenna and thereby reduce line losses. As shown in FIG. 2, two high frequency GaAs FETs (Gallium arsenide field effect transistors) 10A and 10B are connected in cascade with impedance matching and coupling capacitors C1, C2 and C3 between the input 11 from the antenna 1 and the output 12 to the converter 6. GaAs FET transistors are capable of providing low noise and high gain in the microwave frequency range.

Each stage 50A and 50B of the amplifier circuit is designed in the common emitter and common source configuration. Each GaAs FET 10A and 10B has a feedback circuit 13A and 13B, respectively connected across it to automatically tune the respective GaAs FET 10A or 10B to the respective input signal. Thus the respective GaAs FET 10A or 10B do not have to be specially tuned for the particular input signals or antenna to which they are connected.

Examining the feedback circuit 13A first, it comprises a voltage divider network comprising resistors R1A, R2A, R3A and R4A and a PNP transistor 14A such as the 2N3906 or equivalent. Bias inputs Vss 15A and Vcc 16A are connected across the voltage divider circuits 17A as shown. In the preferred embodiment of the invention these Vss and Vcc inputs 15A and 16A are −5 and +12 volts, direct current respectively.

The emitter 20A of the transistor 14A of each feedback circuit is connected to the drain 22A of GaAs FET 10A. The collector 24A of the transistor 14A is connected through resistor R5A to the gate 26A of the GaAs FET 10A. The base 19A of the transistor 14A is connected to a voltage and current bias between resistors R1A and R2A.

The second stage 14B similarly includes GaAs FET 10B and its feedback circuit 13B which is designed and operates analogously. If the current of the signal input to the gate 26A of GaAs FET 10A should increase, the current of the collector 24A in transistor 14A will increase causing a decreasing in the voltage across the transistor 14A (VcE). At the same time, any increase in the gate current 26A will cause the current in the drain 22A to increase by flow to Vcc, which will cause the current in the emitter 20A of transistor 14A to decrease by pulling the current away from emitter 20A. This, in turn, will cause the current in the collector 24A of transistor 14A to decrease, thus decreasing the current of the gate 26A of the GaAs FET 10A, thereby stabilizing the FET 10A. With this design, an active feedback bias for the GaAs FET 10A is developed.

The particular values of the resistances R1 to R4 are selected to keep the respective GaAs FET 10 in their optimum operating region to ensure that it operates as a Class A amplifier, in its optimum operating condition at all times.

To bias the GaAs FET 10 into its optimum operating region the gate 26 to source 27 is reverse biased and the drain 22 to source 26 is biased to the "saturation region" greater than 3 volts. This bias is enabled by the voltage divider network 17 with the active component, transistor 14, resistors R1, R2 and R4 of 10 K Ohms, and R3 of 560 Ohms. In this example, resistors R5 are each 100 K Ohms and coupling capacitors C1, C2 and C3 are each 5.6 pF.

In FIG. 2, the capacitors C4, C5, C6, C7 and C8 all serve as bypass capacitors and in the specific embodiment are each 100 pF.

With the Low-Noise Amplifier Circuit 4 of this invention, no pre-tuning is necessary since the amplifier stages 10A and 10B are designed for optimum performance by the feedback circuits 13A and 13B for a preselected frequency range. The input to the LNA 4 from a microwave antenna 1 is typically in the −70 to −130 dB range. When the input signal to the first GaAs FET 10A changes at 26A, the output of 22A also changes which change is sensed by transistor 14A in the first feedback circuit 13A. Transistor 14A has a generally lower frequency response capability but adjusts the gain of the GaAs FET 10A as a function of its output signal and is designed to automatically hold the gain within its frequency response capabilities to the optimum range for the GaAs FET 10A. Using this design, the low frequency response of transistor 14 effectively smooths and averages the gain response of the GaAs FET 10. The same effect occurs in the second stage 14B of the circuit. The gain of each circuit stage 14A and 14B is nominally about 17 dB.

In the preferred embodiment of the invention, the GaAs FETs used are MGF-1404-11-07 (10A) and MGF-1202 or 1203 (10B) manufactured by MITSUBISHI and are designed for operation in the L-to-C band.

In the LNA 4 circuit shown in FIG. 2, Vcc, the 12 volt supply voltage at input 16 may be separately and externally provided and connected on the printed circuit board to the two feedback circuit Vcc inputs 16A and 16B by suitable jumpers. Alternatively, the 12 volt supply input may be provided over the output line by having a 12 volt dc voltage superimposed over the signal conductor of a conventional coaxial cable connected to output 12 from the down converter. The 12 volt dc voltage is isolated from the amplifying circuits 14 by capacitor C3 and connected to the feedback circuit by suitable jumpers.

A suitable Vss −5 volt supply for input 15A and 15B may be provided from an external source or alternatively through a conventional charge pump type supply from the Vcc +12 volt supply. Using this design, the ultimate receiver 2 can provide the supply voltages through the down converter 6 to power the LNA circuit 4 or, alternatively, external supplies may be used with suitable wiring in the LNA circuit 4.

The LNA circuit 4 of this invention employs the GaAs FET 10 devices to provide signal amplification in the microwave frequency range. Further, feedback circuit 13 design using a low-frequency transistor provides a smooth low-frequency feedback circuit response to the GaAs FET output 22 signal and thereby automatically adjusts the gain of the amplifier circuit 10 to keep the GaAs FET device in its most efficient operating range.

FIG. 3 is a block diagram of the down converter 6 which converts the 1–40 GHz microwave frequency to a nominal 70 MHz intermediate frequency. The down converter 6 is a single conversion image reject down converter using an image recovery mixer system. The output signal from the low-noise amplifier 4 circuit (FIG. 2), which in this application is typically in the 3.7 to 4.2 GHz range is connected to a lossless input microstrip matching network 18A. The matching network elements consist of strip lines etched on one side of a double sided RT/Duroid (0.028 thickness) microwave printed circuit board. From the lossless in phase signal input network the signal is connected to a 90 degree divider 18B, which is also etched on one side of the same P.C. Board. This splits the signal into two parts, 19 and 20 which are 90 degrees out of phase. Each of these signals 19 and 20 is coupled to a pair of balanced mixers A and B, 21 and 22. Also connected to each of the mixers through an in phase divider network which are striplines is a tunable local oscillator 23 which provides an output signal 24 in the microwave range which is controlled by a controllable input voltage at 25. The two phases of the input signals and the respective two phases of the local oscillator signals are combined in the A and B mixers 21 and 22 to generate the output intermediate frequency (IF) signals 27 and 28. The two intermediate IF signals 27 and 28 are coupled to a quadrature 90 degree IF combiner 31 through two low frequency filter amplifiers 29 and 30, respectively. This recombines the 90 degree out of phase IF signals 27 and 28, and couples the combined signals 32 in phase with no signal loss to the I.F. amplifier 33 to output a 70 MHz amplified signal 34 to a suitable receiver. The output 32 will be typically in the 70 MHz range.

With the use of computer aided design techniques, and low parasitis schottky diodes, (hot carrier diodes) image enhancement is achieved over the 3.7 to 4.2 GHz bandwidths, and provides a minimum cancellation of 15 db of the image signal. Complete cancellation is never achieved. This circuit will also reduce high frequency random noise by the low frequency amplifiers 29, 30 and 33.

Figure 4:
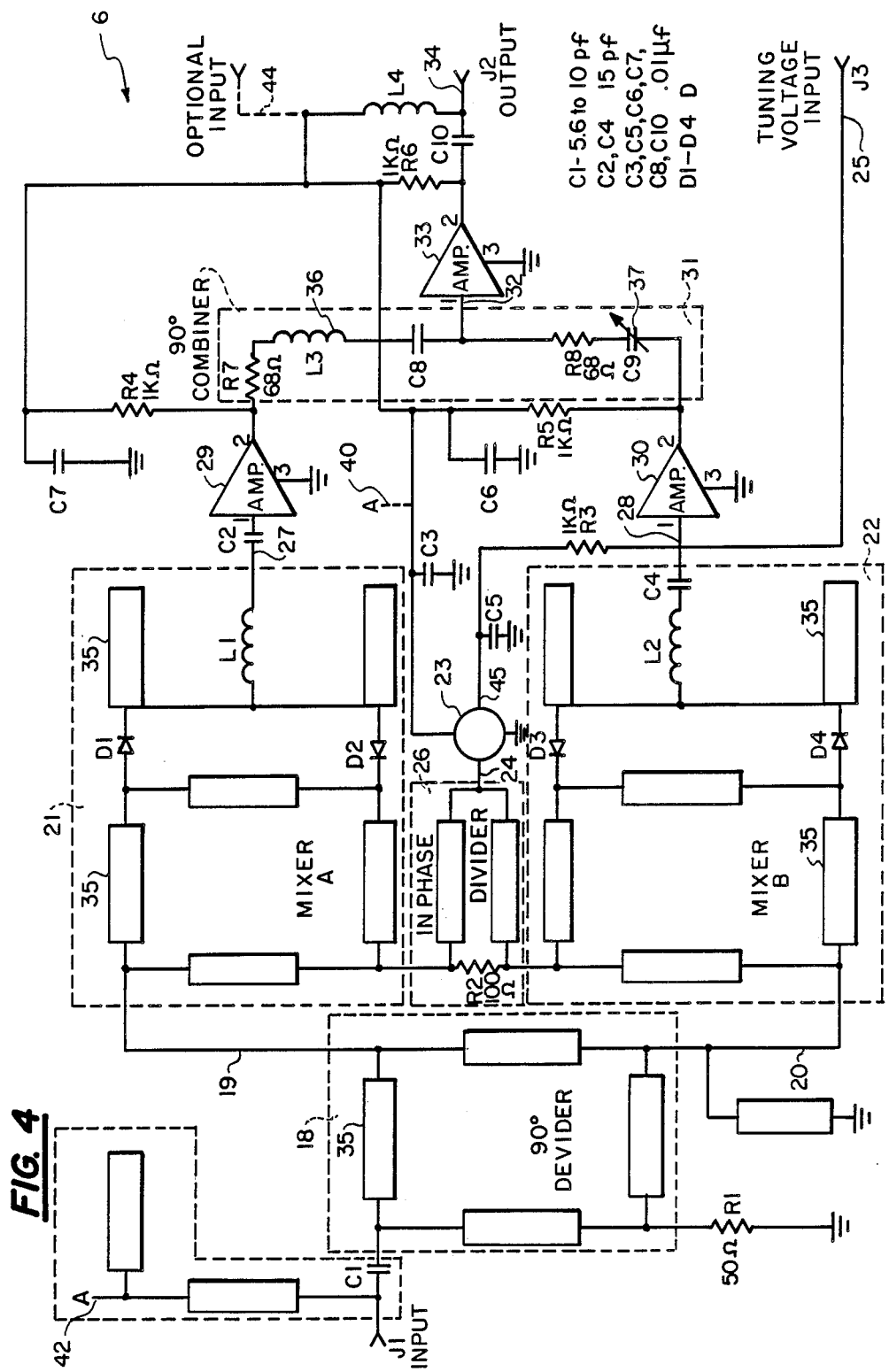
FIG. 4 is a circuit diagram of the down converter circuit of the system of FIG. 3.

FIG. 4 shows the down converter circuit 6 in more detail. As shown, the two port lossless input matching network 60, the 90 degree input divider 18, the A and B constituent mixers 21 and 22, the in phase divider 26 are each designed of strip lands 35 represented in the drawings as simple rectangles which function in the microwave frequency range as electronic components. These shaped strips of land are etched on a printed circuit board. The A and B mixers 21, 22 also include schottky diodes D1, D2, D3 an D4 connected as shown for down conversion.

The 90 degree combiner 31 includes an inductor 36 and a variable capacitor 37 which allows precise adjustment for image rejection. Optimum image rejection is accomplished with the system set up to receive a picture in the middle of the IF band. Capacitor 37 is then adjusted for best picture quality.

The converter circuit and physical layout require careful design of the microwave strips and component selection. The design of the embodiment shown in FIG. 4 is for a nominal GHz input frequency signal, +0.5 GHz.

The output of the down converter 6 is connected via coaxial cabling 8 to a suitable satellite receiver. Such receivers may provide a 12 volt dc supply voltage for the down converter 6 and ultimately to the LNA 4 by being superimposed over the signal conductor 34 via the center connector of the cable 8. The 12 volt dc is conducted to point 40 and around the oscillator 23, in phase divider 26 and the A and B mixers 21 and 22 by suitable jumper from point 40 to 42. Alternatively, an external separate 12 volt dc supply voltage may be connected at optional input 44.

A conventional satellite receiver 2 would include a receiver, with negative tuning supply and +12 to +15 power supply, for converting the 70 MHz signal to provide video and audio signals for a video modulator which would be connected to a suitable monitor or television.

The down converter 6 requires a tuning voltage to operate and control the voltage controlled local oscillator 23. The voltage controlled local oscillator 23 is a self-contained microwave oscillator capable of out putting 10 db and can be tuned from 3,630 MHz to 4,130 MHz by applying a +5 to +15 signal voltage level on its tuning terminal 45. Accordingly, a tuning voltage input is provided at 25 for adjusting the frequency of the local oscillator 23 to the A and B constituent mixer circuits 21 and 22.

Circuits which are suitable for the preferred embodiment of this invention include a VCO 8360 voltage controlled oscillator by Avantek, Inc. The MWA-110 Motorola amplifier is an appropriate microwave amplifier. The variable capacitor 37 is an adjustable 9 to 35 pf variable capacitor. The inductors L1, L2, L3 and L4 are 0.33 microhenry inductors. The diodes D1, D2, D3 and D4 are D5845 by Alpha Industries, Inc.

The LNA 4 and down converter 6 are easy to build on suitable printed circuit boards, with some of the components being provided by strip lands on the printed circuit boards. The converter 6 printed circuit boards will include a bypass for feeding the supply voltage from the receiver to the LNA 4 circuit. The LNA 4 and down converter 6 should be mounted at or very near to the feed point of the antenna 1. The LNA 4 and down converter 6 will intercept, amplify and down convert the satellite microwave frequency signal from a satellite and produce a good IF signal for a suitable receiver.

Although a preferred embodiment of the invention has been described above by way of example, it will be understood by those skilled in the art that changes and modifications may be made without departing from the scope of the invention, which is defined by the appended claims.

What is claimed is:

1. An amplifier and down converter system for coupling an antenna output to a receiver, comprising:
a low-noise receiving amplifier circuit for amplifying the antenna signal above background noise, comprising at least one microwave frequency amplifier having an input for receiving the microwave signal and an output for providing an amplified microwave output signal, and an automatic feedback means connected across the input and output of the amplifier to reverse bias the amplifier into an optimum operating range, said feedback means comprising a low frequency response transistor having an emitter, a collector and a base, the transistor emitter being connected to the amplifier output and the transistor collector being connected to the amplifier input, and power supply means for providing a bias voltage to the transistor base; and
a separate down converter circuit connected to the output of the amplifier circuit, the down converter circuit comprising means for splitting the input signal into two parts 90 degrees out of phase with one another, tunable local oscillator means for providing an adjustable microwave frequency signal, means for splitting the adjustable microwave frequency into two parts 90 degrees out of phase with one another, means for combining each part of the input signal with a respective part of the adjusted microwave frequency signal, means for recombining each part of the mixed signal so as to reject image signals, and means for connecting the resultant signal to a receiver.

2. The system of claim 1, wherein the amplifier and down converter circuits are provided on separate printed circuit boards.

3. A microwave signal amplifier circuit comprising:
at least one high frequency transistor amplifier for receiving and amplifying the microwave signal, said transistor amplifier comprising a microwave frequency field effect transistor including a gate, a source, and a drain;
an automatic feedback means connected between the gate and drain of said transistor amplifier to reverse bias the amplifier into an optimum operating range, said feedback means comprising an active transistor circuit element for controlling the bias voltage of said amplifier as a function of the output signal of the transistor amplifier, said active circuit element comprising means responsive to changes in the output signal of said transistor amplifier;
said active circuit element comprising a low frequency response transistor having an emitter, a collector and a base, the transistor emitter being connected to the field effect transistor drain and the transistor collector being connected to the field effect transistor gate, the transistor base being connected to a voltage divider circuit means for providing a bias voltage to the transistor base and the transistor collector and emitter being further connected, respectively, to said voltage divider means.

4. The microwave signal amplifier circuit of claim 3, wherein two transistor amplifiers are connected in cascade.

* * * * *